(12) United States Patent
Ahn

(10) Patent No.: US 7,247,533 B2
(45) Date of Patent: Jul. 24, 2007

(54) METHOD OF FABRICATING SEMICONDUCTOR DEVICE USING SELECTIVE EPITAXIAL GROWTH

(75) Inventor: Heui Gyun Ahn, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 38 days.

(21) Appl. No.: 11/024,660

(22) Filed: Dec. 30, 2004

(65) Prior Publication Data
US 2005/0142790 A1    Jun. 30, 2005

(30) Foreign Application Priority Data
Dec. 31, 2003    (KR) .................... 10-2003-0102072

(51) Int. Cl.
*H01L 21/8238*    (2006.01)
(52) U.S. Cl. .................... 438/222; 438/429; 438/270; 438/700; 257/E21; 257/548; 257/571
(58) Field of Classification Search ............... 438/429, 438/222, 270, 700, 341, 416, 474, 475, 655, 438/680, 740, 755, 513, 514
See application file for complete search history.

(56) References Cited

U.S. PATENT DOCUMENTS

| | | | |
|---|---|---|---|
| 6,204,137 B1 * | 3/2001 | Teo et al. ................. | 438/305 |
| 6,306,723 B1 * | 10/2001 | Chen et al. ............... | 438/429 |
| 2004/0070023 A1 * | 4/2004 | Kim et al. ................ | 257/315 |

* cited by examiner

*Primary Examiner*—David Nhu
(74) *Attorney, Agent, or Firm*—Lowe Hauptman & Berner LLP

(57) ABSTRACT

A method of fabricating a semiconductor device uses selective epitaxial growth (SEG), by which leakage current generation is minimized using lateral SEG growth in case a contact intrudes a shallow track isolation feature. The method includes steps of forming a sidewall spacer on a gate, selectively growing an epitaxial layer in a lateral direction relative to the sidewall spacer and the gate, and forming a contact on the epitaxial layer.

12 Claims, 4 Drawing Sheets

METHOD OF FABRICATING SEMICONDUCTOR DEVICE USING SELECTIVE EPITAXIAL GROWTH

BACKGROUND OF THE INVENTION

1. Field of the Invention

The present invention relates to a method of fabricating a semiconductor device, and more particularly, to a method of fabricating a semiconductor device using selective epitaxial growth, by which leakage current caused by a contact between a device and metal is prevented from occurring.

2. Discussion of the Related Art

Generally, as patterns of semiconductor devices are getting more finely reduced and more highly integrated, it becomes increasingly necessary to reduce a size of a wiring contact. Yet, the contact size cannot be reduced indefinitely due to the limitation of an aspect ratio of the contact.

It is highly probable that a contact intrudes an isolation area (STI) in such modern devices. Hence, an interface between silicon and oxide is vulnerable to leakage current.

FIG. 1A shows a cross-sectional diagram of a contact according to a related art, in which a portion bisected along a line A–A' in FIG. 1B is shown.

Referring to FIG. 1A, in an area WELL A, when a contact 1 is formed, an interface between an STI oxide layer and STI silicon is vulnerable to various processes such as cleaning, etch, silicidation, and the like. Hence, the contact 1 may be formed deeper than is shown in the drawing.

In a case where the contact intrudes the STI interface, as shown in the area WELL A, a distance between a junction and substrate 2 becomes shorter, thus giving rise to leakage current.

FIG. 1C is a magnified cross-sectional diagram of a contact according to a related art.

Referring to FIG. 1C, in case of STI (shallow trench isolation), a device isolation property is excellent. Yet, a contact hole 1 intrudes into the STI boundary to trigger the leakage current. The shorter the distance 3 between the contact and junction, the more likely sizable leakage current is generated. And, FIG. 2A and FIG. 2B are real photos of contacts according to the related art.

To overcome the above-mentioned problem, selective epitaxial growth, (SEG) which is disclosed in Korean Patent Application Laid-Open Nos. 2001-73705, 2001-45423, or 2001-10442, is employed.

In Korean Patent Application Laid-Open No. 2001-73705, a method of growing SEG between a substrate and contact area is disclosed, in which a contact area is increased to secure a recess margin for overetch and to lower contact resistance.

However, as a width of a device is reduced, a contact is overlapped with a device isolation layer. Hence, it is unable to improve the problem of leakage current occurring.

In Korean Patent Application Laid-Open No. 2001-45423, SEG is employed as a design rule is further reduced to prevent a wordline and semiconductor substrate from being damaged by a contact etch prior to forming a contact.

However, there is no thickness difference between the SEG and gate. Consequently, the SEG is too thick for effectively fitting in a nano-sized and highly integrated semiconductor device.

SUMMARY OF THE INVENTION

Accordingly, the present invention is directed to a method of fabricating a semiconductor device using selective epitaxial growth that substantially obviates the above-described as well as one or more problems due to limitations and disadvantages of the related art.

An object of the present invention is to provide a method of fabricating a semiconductor device using selective epitaxial growth, by which leakage current generation is minimized by using lateral growth in addition to normal SEG growth, in case that a contact intrudes the STI.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a semiconductor device according to the present invention includes the steps of forming a sidewall spacer on a gate, selectively growing an epitaxial layer in a lateral direction on the sidewall spacer, and forming a contact on the epitaxial layer.

Preferably, the method further includes the step of forming a source/drain under the sidewall spacer after the sidewall forming step.

Preferably, the method further includes the step of forming a source/drain under the sidewall spacer after the epitaxial layer growing step.

Preferably, the epitaxial layer is grown by low pressure chemical vapor deposition at a temperature of 700~950° C. using $Si_2H_2Cl_2$ or $SiH_4$ as a base material with HCl and diluted $H_2$ gas.

Preferably, the epitaxial layer is grown by low pressure chemical vapor deposition at a temperature of 600~750° C. using $Si_2H_6$ or $Cl_2$ as a base material with HCl and diluted $H_2$ gas.

Preferably, the method further includes the step of performing silicidation after the epitaxial layer growing step.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
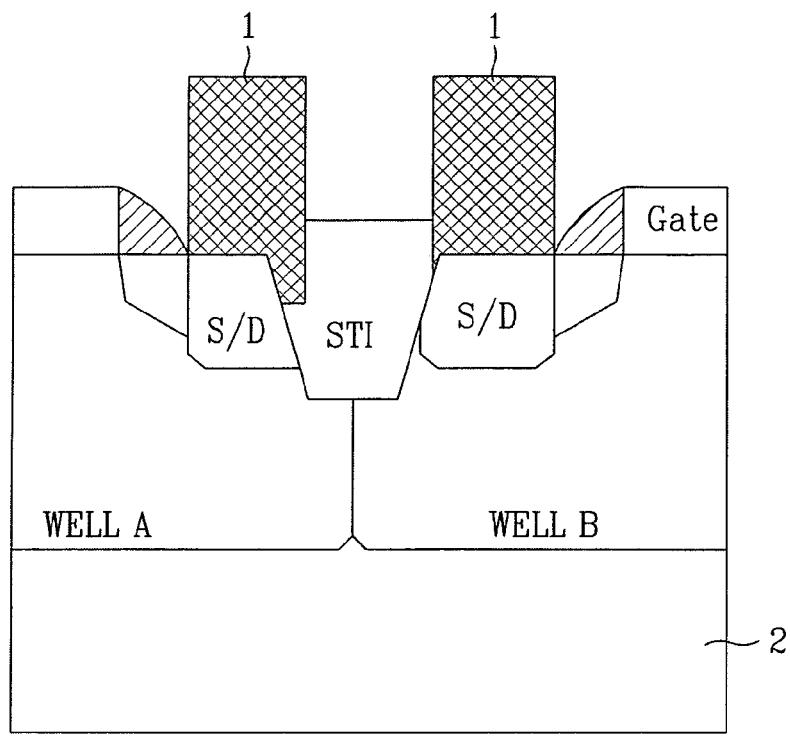
FIG. 1A is a cross-sectional diagram of a contact according to the related art.
Figure 1B:
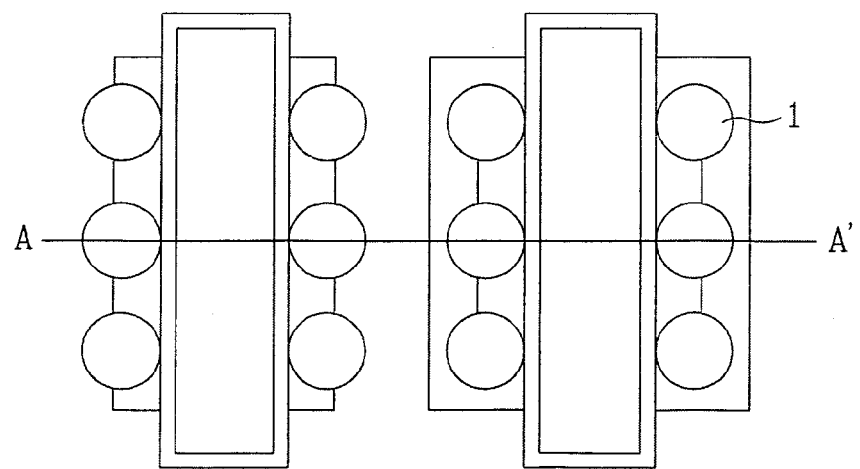
FIG. 1B is a layout of contacts according to the related art.
Figure 1C:
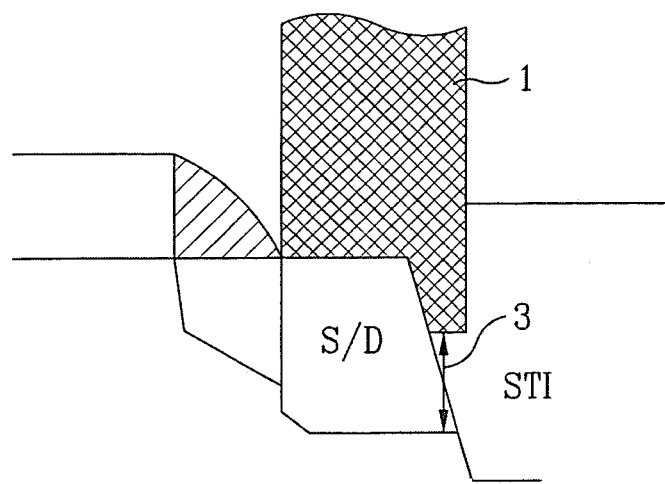
FIG. 1C is a magnified cross-sectional diagram of a contact according to the related art.
Figure 2A:
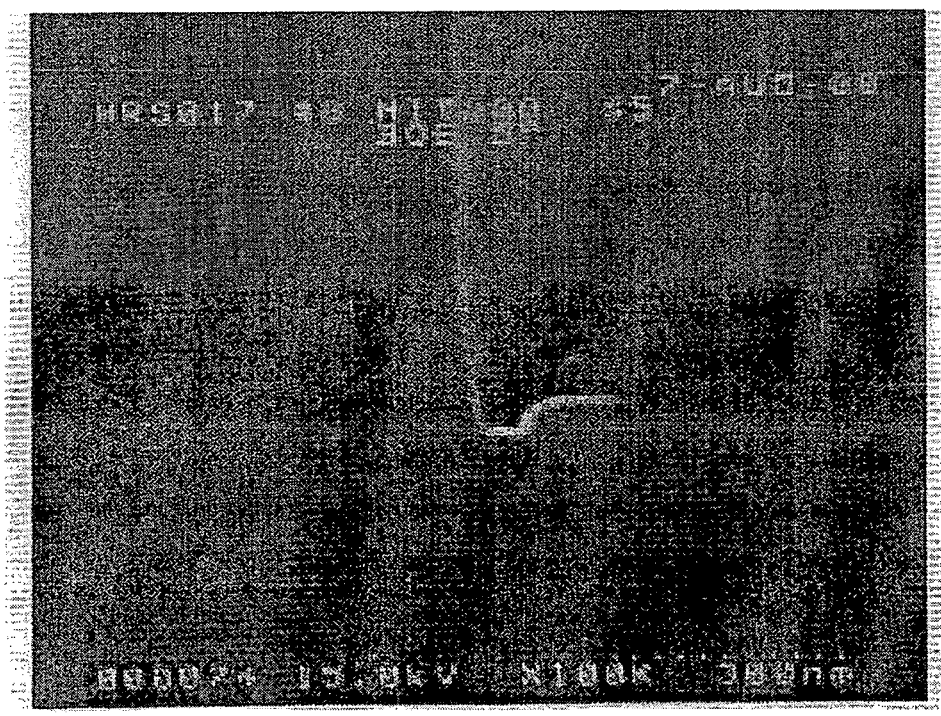
FIG. 2A and FIG. 2B are real photos of contacts according to the related art.
Figure 2B:
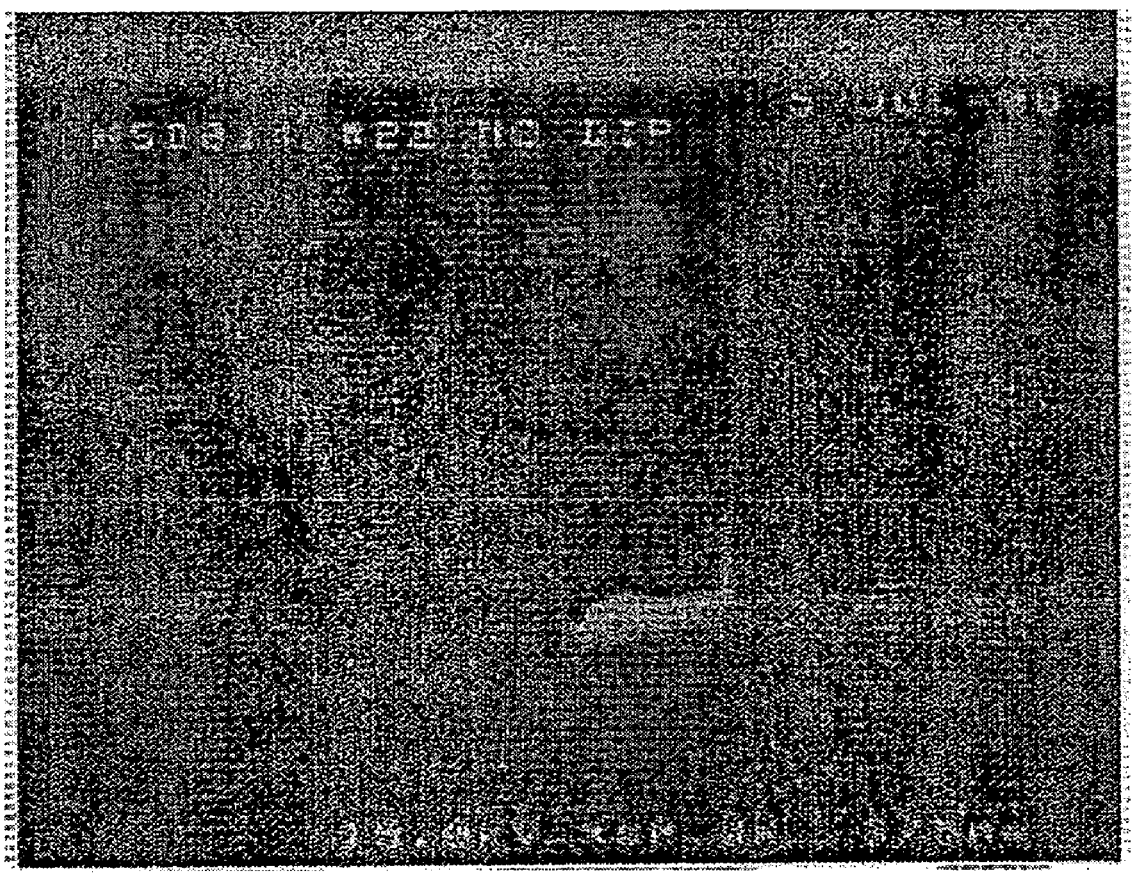
Figure 3A:
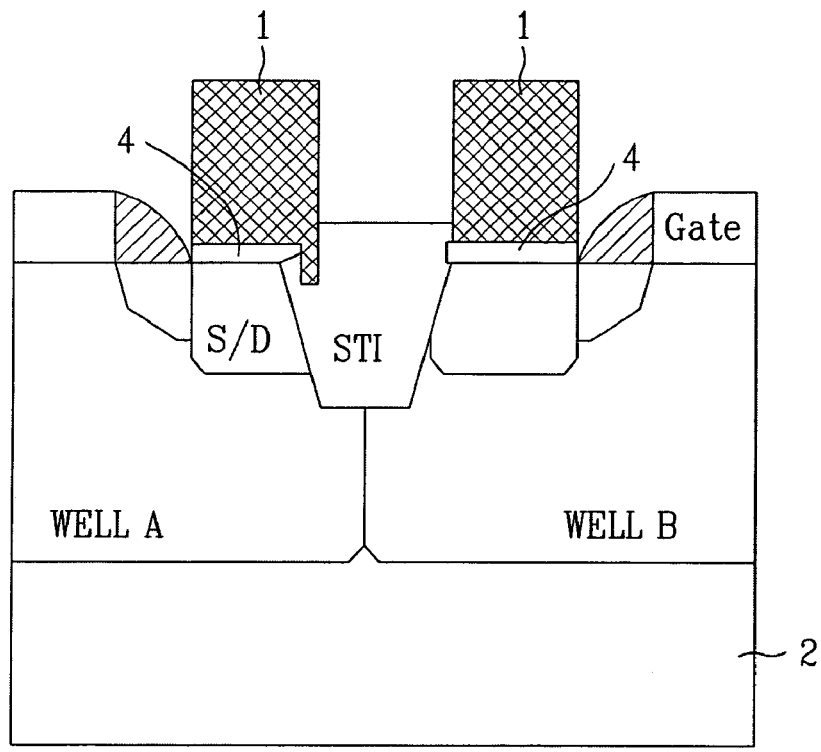
FIG. 3A and FIG. 3B are cross-sectional diagrams of a contact using selective epitaxial growth according to the present invention.
Figure 3B:
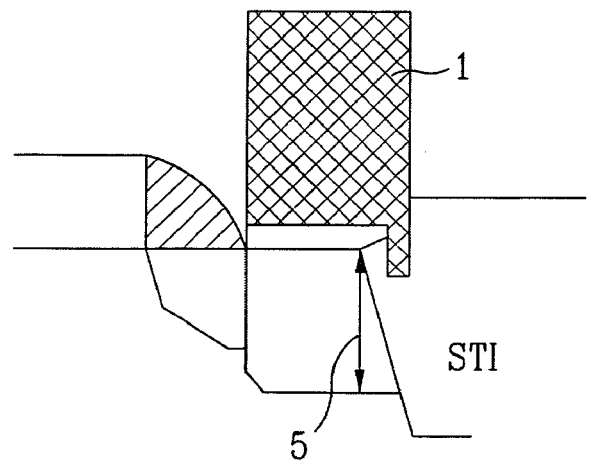

FIG. 3A and FIG. 3B are cross-sectional diagrams of a contact using selective epitaxial growth according to the present invention.

FIG. 3A shows a cross-sectional view of a contact using SEG.

Referring to FIG. 3A, SEG lateral growth is used for a boundary protection of STI on forming a contact hole. Preferably, SEG is preferentially grown in a lateral direction.

The SEG lateral growth 4 is carried out after completion of forming a sidewall spacer of a gate and source/drain S/D. In doing so, a sequence of forming the sidewall spacer and source/drain S/D is not restricted.

If silicidation of W, Ti, Co, Ni or the like is further carried out after completion of the SEG lateral growth, it will be more effective as an etch stop layer for the STI boundary protection on etching the contact hole.

The SEG lateral growth 4, which is selectively enabled on a conductor only, employs low pressure chemical vapor deposition at an appropriate temperature (700~950° C.) using $Si_2H_2Cl_2$ or $SiH_4$ as a base material with HCl and diluted $H_2$ gas. Optionally, $Si_2H_2Cl_2$ or $SiH_4$ are replaced by $Si_2H_6$ or $Cl_2$ at a different process temperature of 600~750° C.

FIG. 3B shows a result of the SEG lateral growth 4 in FIG. 3A from a portion of SEG toward the contact intruding STI.

Referring to FIG. 3B, the SEG lateral growth is possible after completion of a sidewall spacer and is possible prior to or after completion of source/drain ion implantation.

And, the lateral growth can secure a process condition enabling itself to be accelerated from the SEG forming method. The SEG having laterally grown plays a role as an etch-stop barrier to prevent the STI boundary from being damaged by various processes. Hence, there exists no portion that a contact plug comes into direct contact with the STI boundary. Hence, a distance 5 between the contact and the source/drain junction becomes farther physically and electrically, whereby the leakage current occurring along the interface or boundary can be abruptly lowered.

Specifically, the SEG later growth (i.e. after forming the sidewall spacer and optionally after forming the source/drain regions) of the present invention enables the thickness of the SEG to be considerably smaller than that of the gate, whereby its application can be better utilized in nano-sized and highly integrated semiconductor devices.

Accordingly, the present invention utilizes the SEG lateral growth to protect a device from leakage current in case of contact intrusion into the STI, to secure a sufficient process margin on etching the contact hole, and to raise the degree of integration by allowing the contact to overlap with the STI.

This application claims the benefit of the Korean Application No. P2003-0102072 filed on Dec. 31, 2003, which is hereby incorporated by reference.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising steps of:
    forming a shallow trench isolation layer;
    forming a sidewall spacer on a sidewall of a gate;
    forming at least one of a source and a drain under the sidewall;
    selectively growing an epitaxial layer in a lateral direction relative to the sidewall spacer and the gate, wherein the epitaxial layer is distinct from the shallow trench isolation layer;
    and forming a contact on the epitaxial layer,
    wherein said step of selectively growing is performed after said forming a sidewall step, and wherein no portion of the contact comes into direct contact with a boundary between the shallow trench isolation layer and the at least one of a source and a drain.

2. The method of claim 1, wherein the least one of a source and a drain is formed under the sidewall spacer after the forming a sidewall step.

3. The method of claim 1, wherein the at least one of a source and a drain is formed under the sidewall spacer after the selectively growing step.

4. The method of claim 1, wherein the epitaxial layer is grown by low pressure chemical vapor deposition at a temperature in an inclusive range of 700° C. through 950° C. using $Si_2H_2Cl_2$ or $SiH_4$ as a base material with HCl and diluted $H_2$ gas.

5. The method of claim 1, wherein the epitaxial layer is grown by low pressure chemical vapor deposition at a temperature in an inclusive range of 600° C. through 750° C. using $Si_2H_6$ or $Cl_2$ as a base material with HCl and diluted $H_2$ gas.

6. The Method of claim 1, further comprising the step of performing silicidation after the selectively growing step.

7. A method of fabricating a semiconductor device, comprising steps of:
    forming a sidewall spacer on a sidewall of a gate;
    selectively growing an epitaxial layer in a lateral direction relative to the sidewall spacer and the gate;
    and forming a contact on the epitaxial layer,
    wherein said step of selectively growing is performed after said forming a sidewall step and,
    wherein no portion of the contact comes into direct contact with a boundary between the shallow trench isolation layer and the at least one of a source and a drain.

8. The method of claim 7, further comprising a step of forming at least one of a source and a drain under the sidewall spacer after forming a sidewall step.

9. The method of claim 7, further comprising a step of forming at least one of a source and a drain under the sidewall spacer after the selectively growing step.

10. The method of claim 7, wherein the epitaxial layer is grown by low pressure chemical vapor deposition at a temperature in an inclusive range of 700° C. through 950° C. using $Si_2H_2Cl_2$ or $SiH_4$ as a base material with HCl and diluted $H_2$ gas.

11. The method of claim 7, wherein the epitaxial layer is grown by low pressure chemical vapor deposition at a temperature in an inclusive range of 600° C. through 750° C. using $Si_2H_6$ or $Cl_2$ as a base material with HCl and diluted $H_2$ gas.

12. The method of claim 7, further comprising the step of performing silicidation after the selectively growing step.

* * * * *